US010395986B1

(12) United States Patent
Briggs et al.

(10) Patent No.: US 10,395,986 B1
(45) Date of Patent: Aug. 27, 2019

(54) FULLY ALIGNED VIA EMPLOYING SELECTIVE METAL DEPOSITION

(71) Applicant: INTERNATIONAL BUSINESS MACHINES CORPORATION, Armonk, NY (US)

(72) Inventors: Benjamin D. Briggs, Waterford, NY (US); James J. Kelly, Schenectady, NY (US); Donald F. Canaperi, Averill Park, NY (US); Michael Rizzolo, Albany, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/992,685

(22) Filed: May 30, 2018

(51) Int. Cl.
| H01L 23/52 | (2006.01) |
| H01L 21/768 | (2006.01) |
| H01L 23/522 | (2006.01) |
| H01L 23/528 | (2006.01) |
| H01L 21/321 | (2006.01) |
| H01L 21/027 | (2006.01) |

(52) U.S. Cl.
CPC .. H01L 21/76897 (2013.01); H01L 21/76816 (2013.01); H01L 21/76834 (2013.01); H01L 21/76877 (2013.01); H01L 23/528 (2013.01); H01L 23/5226 (2013.01); H01L 21/0276 (2013.01); H01L 21/3212 (2013.01); H01L 21/7684 (2013.01); H01L 21/76843 (2013.01)

(58) Field of Classification Search
CPC ......... H01L 21/76897; H01L 21/76834; H01L 21/76877; H01L 21/76816; H01L 23/5226; H01L 23/528

USPC .......................................................... 257/774
See application file for complete search history.

(56) References Cited

U.S. PATENT DOCUMENTS

| 5,674,787 | A | 10/1997 | Zhao et al. |
| 6,893,957 | B2 | 5/2005 | Trivedi et al. |
| 7,008,872 | B2 | 3/2006 | Dubin et al. |
| 7,300,867 | B2 | 11/2007 | Gambino et al. |
| 7,696,085 | B2 * | 4/2010 | Li ....................... H01L 21/0337 257/E21.219 |
| 9,190,316 | B2 * | 11/2015 | Brink ................ H01L 21/76802 |
| 9,236,292 | B2 | 1/2016 | Romero et al. |

(Continued)

OTHER PUBLICATIONS

Anonymous, "A Structure and Method for bi-directionally self aligned vias (bSAV)," An ip.com Prior Art Database Technical Disclosure. IP.com No. IPCOM000201787D. IP.com Electronic Publication: Nov. 23, 2010. pp. 1-4.

(Continued)

*Primary Examiner* — Luan C Thai
(74) *Attorney, Agent, or Firm* — Tutunjian & Bitetto, P.C.; Vazken Alexanian (57) ABSTRACT

A method is presented for creating a fully-aligned via (FAV) by employing selective metal deposition. The method includes forming metal lines within a first inter-layer dielectric (ILD) layer, forming a second ILD layer over the first ILD layer, forming a lithographic stack over the second ILD layer to define areas where via growth is prevented, recessing the lithographic stack to expose a top surface of the metal lines where via growth is permitted by the lithographic stack, and performing metal growth over the exposed top surface of the metal lines where via growth is permitted.

19 Claims, 7 Drawing Sheets

(56) References Cited

U.S. PATENT DOCUMENTS

| | | |
|---|---|---|
| 9,324,650 B2 * | 4/2016 | Edelstein ............ H01L 23/5226 |
| 9,607,893 B1 | 3/2017 | Zhang et al. |
| 2009/0200683 A1 | 8/2009 | Colburn et al. |
| 2011/0079910 A1 | 4/2011 | O'brien et al. |
| 2013/0207270 A1 | 8/2013 | Holmes et al. |
| 2013/0328208 A1 | 12/2013 | Holmes et al. |
| 2014/0363969 A1 | 12/2014 | Chen et al. |
| 2015/0091181 A1 | 4/2015 | Li et al. |
| 2015/0171010 A1 | 6/2015 | Bristol et al. |
| 2016/0163587 A1 * | 6/2016 | Backes ............ H01L 21/76849 257/751 |
| 2016/0254181 A1 | 9/2016 | Padhi et al. |

OTHER PUBLICATIONS

Anonymous, "bi-directional self aligned vias," An ip.com Prior Art Database Technical Disclosure. IP.com No. IPCOM000231097D. IP.com Electronic Publication: Sep. 26, 2013. pp. 1-6.

* cited by examiner

FULLY ALIGNED VIA EMPLOYING SELECTIVE METAL DEPOSITION

BACKGROUND

Technical Field

The present invention relates generally to semiconductor devices, and more specifically, to forming a fully aligned via by employing selective metal deposition.

Description of the Related Art

As process dimensions continue to shrink, litho-etch patterning for semiconductor devices is usually needed to print 64 nanometer (nm) pitch metal layers (Mx levels) or below. However, poor overlay can be a significant factor for consideration in successful patterning applications. For example, without self-aligned via (SAV) processes, the dielectric space between copper lines and vias can become small, which can cause reliability issues. Further, current SAV processes are usually self-aligned only in one direction. A weak point for the reliability failure mechanism of time dependent dielectric breakdown can form due to the proximity of the via bottom to an unrelated metal beneath it. A breakdown can occur along this interface leading to increased leakage or a dead short, thus compromising product functionality.

SUMMARY

In accordance with an embodiment, a method is provided for creating a fully-aligned via (FAV) by employing selective metal deposition. The method includes forming metal lines within a first inter-layer dielectric (ILD) layer, forming a second ILD layer over the first ILD layer, forming a lithographic stack over the second ILD layer to define areas where via growth is prevented, recessing the lithographic stack to expose a top surface of the metal lines where via growth is permitted by the lithographic stack, and performing metal growth over the exposed top surface of the metal lines where via growth is permitted.

In accordance with an embodiment, a method is provided for creating a fully-aligned via (FAV) by employing selective metal deposition. The method includes forming metal lines within a first inter-layer dielectric (ILD) layer, forming an insulating etch stop layer over the metal lines, forming a second ILD layer over the insulating etch stop layer, forming a lithographic stack over the second ILD layer to define areas where via growth is prevented, recessing the lithographic stack to expose a top surface of the metal lines where via growth is permitted by the lithographic stack, performing metal growth over the exposed top surface of the metal lines where via growth is permitted, and depositing a conformal metal nitride cap over the metal growth such that airgaps are formed between the metal growth and the second ILD layer.

In accordance with another embodiment, a semiconductor device is provided for creating a fully-aligned via (FAV) by employing selective metal deposition. The semiconductor device includes metal lines disposed within a first inter-layer dielectric (ILD) layer, a second ILD layer disposed over the first ILD layer, a metal growth disposed over exposed metal lines where via growth is permitted, and a conformal metal nitride cap disposed over the metal growth such that airgaps are formed between the metal growth and the second ILD layer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing fully-aligned vias (FAVs) for low capacitance wiring in semiconductor devices. The FAVs are formed by selective metal deposition techniques. With the 7 nm technology node in the development phase and the 5 nm node moving into development, transistor scaling gets ever more complex. On top of that, performance benefits gained at the front-end-of-line (e.g., the transistors) can easily be undone if similar improvements are not made in the back-end-of-the-line (BEOL). BEOL processing involves the creation of stacked layers of metal wires that electrically interconnect transistors in a chip. With each technology node, this metal wiring scheme becomes more complex, mainly because there are more transistors to connect with an ever tighter pitch. Shrinking dimensions also means the wires have a reduced cross-sectional area, which drives up the resistance-capacitance product (RC) of the interconnect system.

Metal-based dual damascene has been the workhorse process flow for interconnects. The metal can be, e.g., copper (Cu). A simple dual damascene flow starts with deposition of a low-k dielectric material on a structure. These low-k films are designed to reduce the capacitance and the delay in the integrated circuits (ICs). In a next step, this dielectric layer is covered with an oxide and a resist, and vias and trenches are formed using lithography and etch steps. These vias connect one metal layer with the layer above or below. Then, a metallic barrier layer is added to prevent metal atoms from migrating into the low-k materials. The barrier layers are deposited with, e.g., physical vapor deposition (PVD), using materials such as, e.g., tantalum and tantalum nitride. In a final step, this structure is seeded, electroplated with a metal (usually Cu), followed by a chemical mechanical planarization (CMP) step.

The present invention generally relates to semiconductor device manufacturing, and more particularly to fabricating a metal line interconnect (via) fully aligned to both a $M_x$ level and a $M_{x+1}$ level. Embodiments in accordance with the present invention provide methods and devices for employing selective metal deposition to build-up vias self-aligned to the intersection of Mx and Mx+1 trench patterns. In one embodiment, the method entails performing an Mx+1 trench first dielectric etch to reveal underlying Mx structures, then after blocking intersections where no via is to be formed, performing selective deposition of a metal via to build up a metal protrusion, depositing and recessing a gap fill dielectric material to surround and encase the grown via "pillars," opening or removing any remaining hardmask or cap material, and performing a single damascene metallization to form the Mx+1 line in the remaining portion of the Mx+1 trench.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
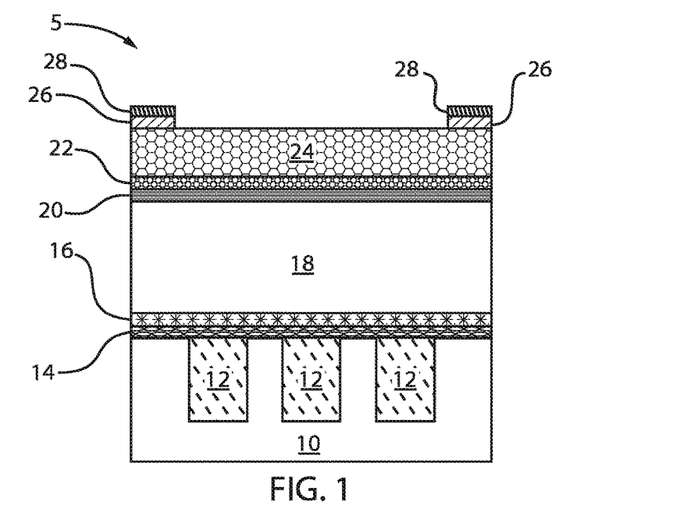
FIG. 1 is a cross-sectional view of a semiconductor structure including at least a plurality of metal lines, in accordance with an embodiment of the present invention.

FIG. 1 is a cross-sectional view of a semiconductor structure including at least a plurality of metal lines, in accordance with an embodiment of the present invention.

A semiconductor structure 5 includes a plurality of metal lines 12 formed within a first inter-layer dielectric (ILD) 10. An insulating etch stop layer 14 can be formed over the metal lines 12. A barrier layer 16 can be formed over the insulating etch stop layer 14. A second ILD 18 can be formed over the barrier layer 16. Then a first sacrificial layer 20 and a second sacrificial layer 22 can be formed over the second ILD 18. An organic planarization layer (OPL) 24 can then be formed over the first and second sacrificial layers 20, 22. Additionally, an anti-reflective coating (ARC) layer 26 and a photoresist layer 28 can be formed over portions of the OPL 24.

The first ILD 10 can include any materials known in the art, such as, for example, porous silicates, carbon doped oxides, silicon dioxides, silicon nitrides, silicon oxynitrides, or other dielectric materials. The first ILD 10 can be formed using any method known in the art, such as, for example, chemical vapor deposition, plasma enhanced chemical vapor deposition, atomic layer deposition, or physical vapor deposition. The first ILD 10 can have a thickness ranging from about 25 nm to about 200 nm.

The dielectric layer 10 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The metal lines 12 (associated with the Mx layer) can be formed in the metal openings or trenches formed in the first ILD 10. The metal lines 12 can be any conductive materials known in the art, such as, for example, copper (Cu), aluminum (Al), or tungsten (W). The metal lines 12 can be fabricated using any technique known in the art, such as, for example, a single or dual damascene technique. In an embodiment, not illustrated, the metal lines 12 can be copper (Cu) and can include a metal liner, where the metal liner can be metals, such as, for example, tantalum nitride and tantalum (TaN/Ta), titanium, titanium nitride, cobalt, ruthenium, and manganese.

The barrier layer 16 can be a dielectric cap. The dielectric material of the dielectric cap can be silicon nitride (SiN), silicon dioxide ($SiO_2$), hafnium oxide ($HfO_2$), etc. In another example embodiment, the dielectric cap 16 can include a material such as: silicon nitride ($Si_3N_4$), silicon carbide (SiC) or silicon carbon (N, H).

The insulating etch stop layer 14 can be, e.g., an aluminum nitride (AlN) layer. Other materials for the insulating etch stop layer 14 can include, but are not necessarily limited to, titanium nitride (TiN), tantalum nitride (TaN), aluminum oxide, titanium oxide, tantalum oxide, and a bilayer of TaN/Ta, which, like TaN, can be selectively and non-selectively removed in accordance with embodiments of the present invention described herein.

The first sacrificial layer 20 can be, e.g., a titanium nitride (TiN) layer and the second sacrificial layer 22 can be, e.g., a nitride layer, such as a silicon nitride (SiN) layer.

The OPL layer 24 and the ARC layer 26 can be employed as a lithographic stack to pattern the underlying layers. The OPL layer 24 is formed at a predetermined thickness to provide reflectivity and topography control during etching of the hard mask layers below. The OPL layer 24 can include an organic material, such as a polymer. The thickness of the OPL 24 can be in a range from about 50 nm to about 300 nm.

The layer 26 is an ARC layer which minimizes the light reflection during lithography for a tri-layer lithography stack. The ARC layer 26 can include silicon, for example, a silicon anti-reflective layer (SiARC). The thickness of the ARC layer 26 can be in range from about 10 nm to about 100 nm. The anti-reflective film layer 20 can be an antireflective layer for suppressing unintended light reflection during photolithography. Exemplary materials for an antireflective layer include, but are not limited to, metal silicon nitrides, or a polymer film. The anti-reflective layer can be formed, depending on materials, for example, using sputter deposition, chemical vapor deposition, or spin coating.

A photolithography process usually includes applying a layer of photoresist material 28 (e.g., a material that will react when exposed to light), and then selectively exposing portions of the photoresist 28 to light or other ionizing radiation (e.g., ultraviolet, electron beams, X-rays, etc.), thereby changing the solubility of portions of the material. The resist 28 is then developed by washing the resist with a developer solution, such as, e.g., tetramethylammonium hydroxide (TMAH), thereby removing non-irradiated (in a negative resist) or irradiated (in a positive resist) portions of the resist layer.

Figure 2:
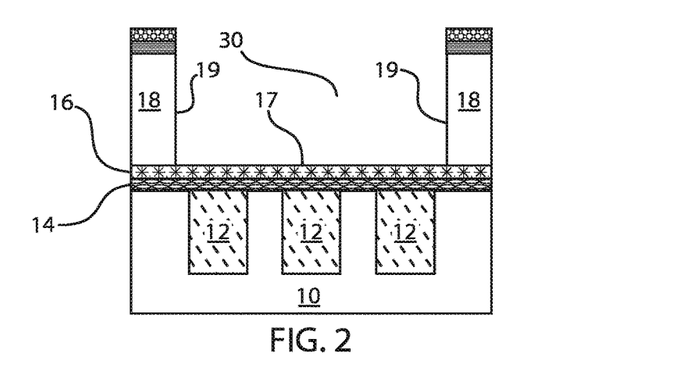
FIG. 2 is a cross-sectional view of the semiconductor structure of FIG. 1 where recessing takes place to expose a top surface of the insulating etch stop layer, in accordance with an embodiment of the present invention.

FIG. 2 is a cross-sectional view of the semiconductor structure of FIG. 1 where recessing takes place to expose a top surface of the insulating etch stop layer, in accordance with an embodiment of the present invention.

In various example embodiments, the OPL 24, the second sacrificial layer 22, the first sacrificial layer 20, and the second ILD 18 are etched to form an opening or trench 30 to expose a top surface 17 of the barrier layer 16. Sidewalls 19 of the second ILD 18 are also exposed.

Figure 3:
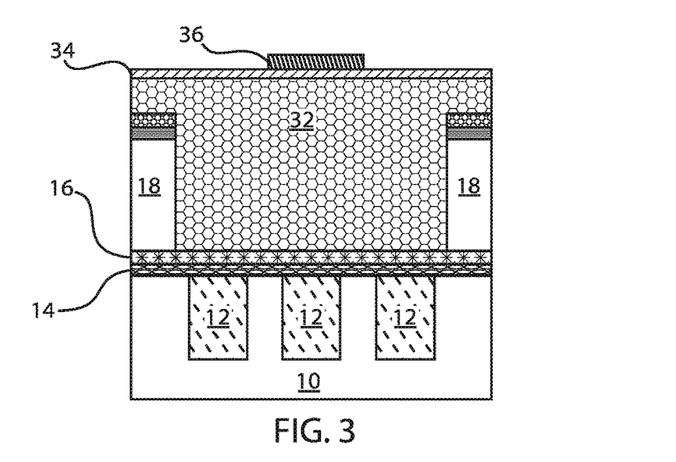
FIG. 3 is a cross-sectional view of the semiconductor structure of FIG. 2 where an organic planarization layer (OPL), an anti-reflective coating (ARC) layer, and a photoresist are deposited, in accordance with an embodiment of the present invention.

FIG. 3 is a cross-sectional view of the semiconductor structure of FIG. 2 where an organic planarization layer (OPL), an anti-reflective coating (ARC) layer, and a photoresist are deposited, in accordance with an embodiment of the present invention.

In various example embodiments, a second OPL 32 is deposited within the opening or trench 30 and in direct contact with the top surface 17 of the barrier layer 16. A second ARC layer 34 is deposited over the second OPL 32. Additionally, a second photoresist 36 is deposited over the second ARC layer 34. The second photoresist 36 defines areas where via growth is blocked or prevented. Stated differently, the second photoresist 36 defines areas where self-aligned via interconnect structures are prevented from being formed.

Figure 4:
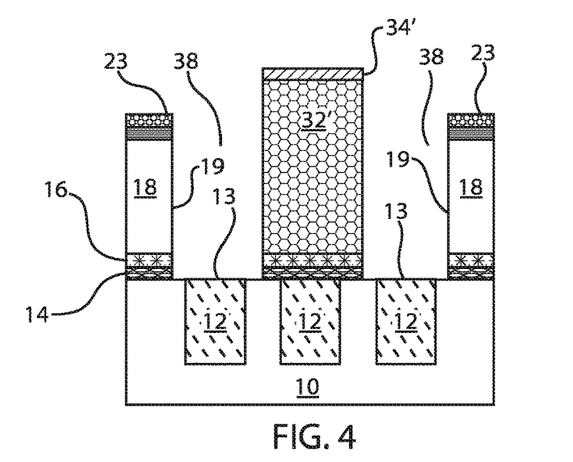
FIG. 4 is a cross-sectional view of the semiconductor structure of FIG. 3 where the photoresist is removed, and the OPL and ARC layer are etched to expose top surfaces of one or more of the plurality of metal lines, in accordance with an embodiment of the present invention.

FIG. 4 is a cross-sectional view of the semiconductor structure of FIG. 3 where the photoresist is removed, and the OPL and ARC layer are etched to expose top surfaces of one or more of the plurality of metal lines, in accordance with an embodiment of the present invention.

In various example embodiments, the second photoresist 36 is removed and etching takes place to expose a top surface 13 of one or more metal lines 12 (where vias are to be formed). The etching results in openings or trenches 38 formed over the exposed metal lines 12. Additionally, a top surface 23 of the second sacrificial layer 22 is exposed. Remaining second OPL 32' and remaining second ARC layer 34' are formed over one or more non-exposed metal lines 12. The remaining second OPL 32' and remaining second ARC layer 34' can be referred to as a blocking island (or Vx pattern). The blocking island prevents vias from being formed. However, certain metal lines (Mx) are opened that are not blocked by the Vx pattern or blocking island. The opened metal lines will accommodate the vias to be formed.

Removal is any process that removes material from the wafer: examples include etch processes (either wet or dry), and chemical-mechanical planarization (CMP), etc.

Figure 5:
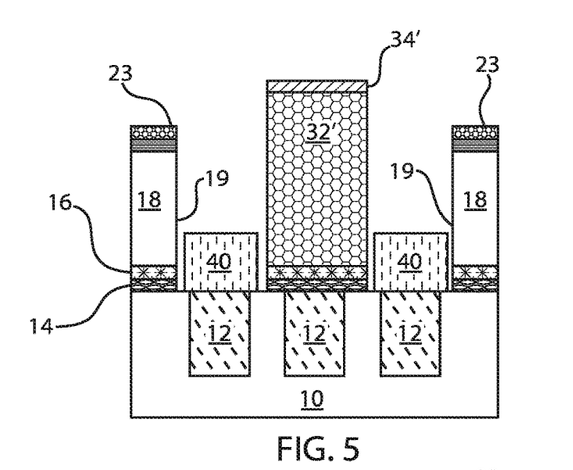
FIG. 5 is a cross-sectional view of the semiconductor structure of FIG. 4 where self-aligned via interconnect structures are formed over the exposed metal lines, in accordance with an embodiment of the present invention.

FIG. 5 is a cross-sectional view of the semiconductor structure of FIG. 4 where self-aligned via interconnect structures are formed over the exposed metal lines, in accordance with an embodiment of the present invention.

In various example embodiments, self-aligned via interconnect structures 40 are formed over the exposed metal lines 12. This can be referred to as a selective metal growth to a desired via height where mushroom or lateral growth occurs and can be controlled with block CD.

The self-aligned via interconnect structure 40 can be used to prevent electromigration, e.g., the transport of material caused by the gradual movement of ions in a conductor due to the momentum transfer between conducting electrons and diffusing metal atoms. In fact, the self-aligned via interconnect structure 40 can prevent two types of failure modes for via interconnect structures and wiring structures: (i) via depletion and (ii) line depletion. Via depletion occurs when electrons flow from a wiring line below into the via interconnect structure above. On the other hand, line depletion occurs when electrons flow from the via interconnect structure down to the wiring line below.

Figure 6:
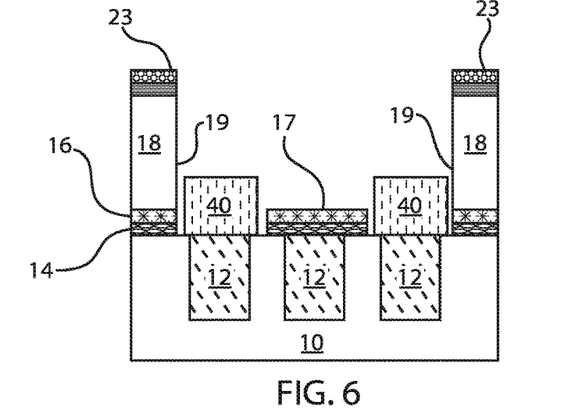
FIG. 6 is a cross-sectional view of the semiconductor structure of FIG. 5 where the remaining OPL and ARC layer are removed to expose a top surface of the insulating etch stop layer, in accordance with an embodiment of the present invention.

FIG. 6 is a cross-sectional view of the semiconductor structure of FIG. 5 where the remaining OPL and ARC layer are removed to expose a top surface of the barrier layer, in accordance with an embodiment of the present invention.

In various example embodiments, the remaining OPL 32' and the remaining ARC layer 34' are removed to expose a top surface 17 of the barrier layer 16. The remaining OPL 32' and the remaining ARC layer 34' can be removed by, e.g., wet etch techniques.

Figure 7:
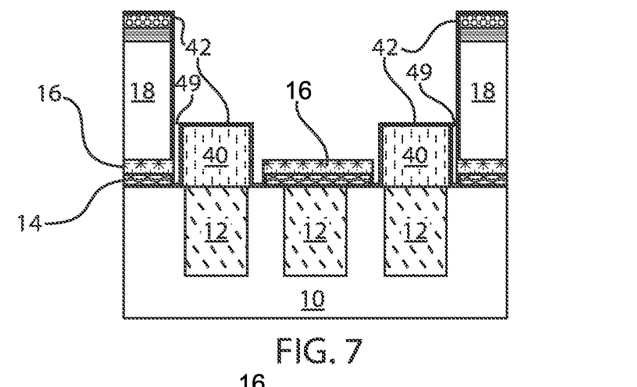
FIG. 7 is a cross-sectional view of the semiconductor structure of FIG. 6 where a conformal metal nitride layer is deposited, in accordance with an embodiment of the present invention.

FIG. 7 is a cross-sectional view of the semiconductor structure of FIG. 6 where a conformal metal nitride layer is deposited, in accordance with an embodiment of the present invention.

In various example embodiments, a conformal metal nitride layer 42 is deposited such that trenches 49 are formed between the second ILD 18 and the self-aligned via interconnect structures or metal growth 40. The conformal metal nitride layer 42 protects the via metal.

Figure 8:
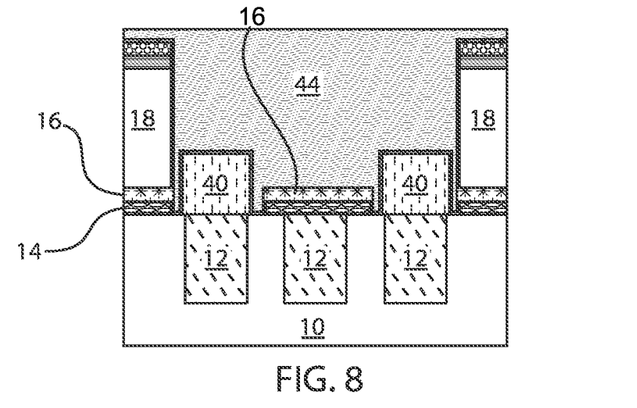
FIG. 8 is a cross-sectional view of the semiconductor structure of FIG. 7 where a low-k material is deposited, in accordance with an embodiment of the present invention.

FIG. 8 is a cross-sectional view of the semiconductor structure of FIG. 7 where a low-k material is deposited, in accordance with an embodiment of the present invention.

In various example embodiments, a low-k material layer 44 is deposited over the conformal metal nitride layer 42.

A low-k dielectric material as used in the low-k dielectric layer 44 can have a dielectric constant that is less than 4.0, e.g., 3.9. In one embodiment, the low-k material layer 44 can have a dielectric constant ranging from about 1.0 to about 3.5. In another embodiment, the low-k material layer 44 can have a dielectric constant ranging from about 1.75 to about 3.2.

One example of a material suitable for the low-k materials for the low-k dielectric layer 44 can include silicon oxycarbonitride (SiOCN). Other low-k materials that can also be used for the low-k dielectric layer 44 can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer 44 can be conformally deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed. In some embodiments, the low-k dielectric layer 44 can have a thickness ranging from about 5 nm to about 30 nm. In another embodiment, the low-k dielectric layer 44 can have a thickness ranging from about 7 nm to about 15 nm.

Figure 9:
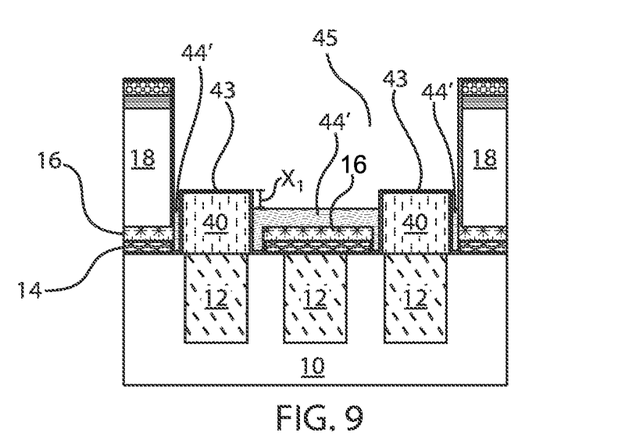
FIG. 9 is a cross-sectional view of the semiconductor structure of FIG. 8 where the low-k material is recessed to expose the conformal metal nitride layer over the self-aligned via interconnect structures, in accordance with an embodiment of the present invention.

FIG. 9 is a cross-sectional view of the semiconductor structure of FIG. 8 where the low-k dielectric layer is recessed to expose the conformal metal nitride layer over the self-aligned via interconnect structures, in accordance with an embodiment of the present invention.

In various example embodiments, the low-k dielectric layer 44 is recessed to create opening 45, such that low-k dielectric portions 44' remain in the trenches 49 formed between the second ILD 18 and the self-aligned via interconnect structures 40. Additionally, low-k dielectric portions 44' remain over the barrier layer 16 between the self-aligned via interconnect structures 40. The recess can extend a distance "Xi" below the top surface 43 of the conformal metal nitride layer 42.

Figure 10:
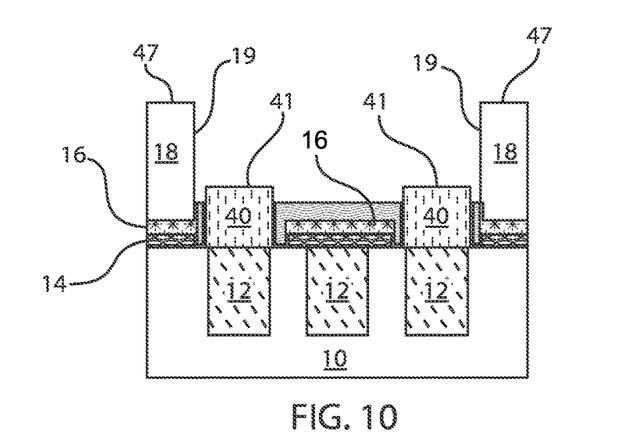
FIG. 10 is a cross-sectional view of the semiconductor structure of FIG. 9 where the exposed conformal metal nitride layer is removed to expose a top surface of the self-aligned via interconnect structures, in accordance with an embodiment of the present invention.

FIG. 10 is a cross-sectional view of the semiconductor structure of FIG. 9 where the exposed conformal metal nitride layer is removed to expose a top surface of the self-aligned via interconnect structures, in accordance with an embodiment of the present invention.

In various example embodiments, the conformal metal nitride layer 42 is removed from the sidewalls 19 of the second ILD 18 and further removed from the top surface of the self-aligned via interconnect structures 40. Thus, a top surface 41 of the self-aligned via interconnect structures 40 is now exposed. Further, a top surface 47 of the second ILD 18 is exposed as the remaining portions or sections of the first and second sacrificial layers 20, 22 are removed. The conformal metal nitride layer 42 can be removed by, e.g., reactive ion etch (RIE) techniques.

Figure 11:
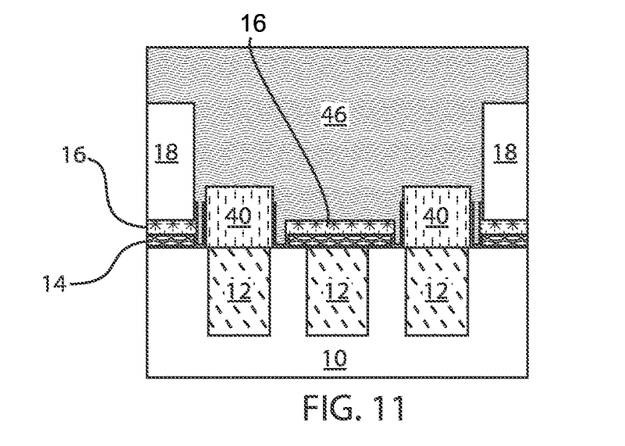
FIG. 11 is a cross-sectional view of the semiconductor structure of FIG. 10 where a metal fill takes place, in accordance with an embodiment of the present invention.

FIG. 11 is a cross-sectional view of the semiconductor structure of FIG. 10 where a metal fill takes place, in accordance with an embodiment of the present invention.

In various example embodiments, a conductive material 46 can be deposited. The metallization can be a single damascene metallization. Thus, only single damascene metallization is needed for the trench, thus enabling dynamic reflow or other fill techniques that are sensitive to pattern and profile needs. The conductive material 46 can be, for example, a metal or doped polysilicon (poly-Si). Non-limiting examples of metals include copper (Cu), cobalt (Co), aluminum (Al), platinum (Pt), gold (Au), tungsten (W), titanium (Ti), or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

Figure 12:
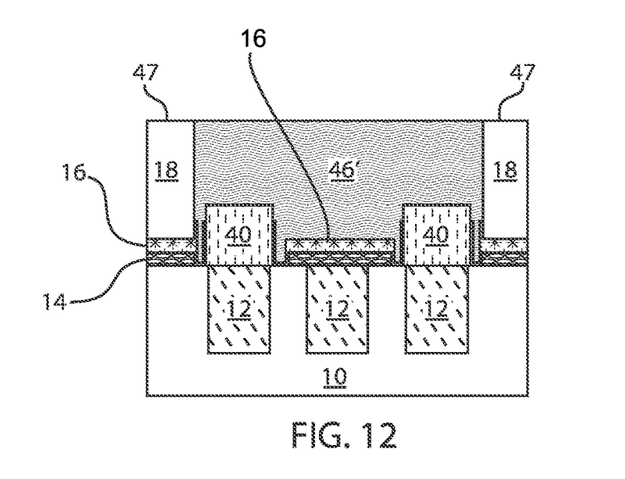
FIG. 12 is a cross-sectional view of the semiconductor structure of FIG. 11 where the metal fill is planarized, in accordance with an embodiment of the present invention.

FIG. 12 is a cross-sectional view of the semiconductor structure of FIG. 11 where the metal fill is planarized, in accordance with an embodiment of the present invention.

In various example embodiments, the conductive material 46 can be planarized such that conductive material 46' remains. The remaining conductive material 46' can be flush with the top surface 47 of the second ILD 18. In various exemplary embodiments, the height of the conductive material 46 can be reduced by chemical-mechanical polishing (CMP) and/or etching. Therefore, the planarization process can be provided by CMP. Other planarization process can include grinding and polishing.

Figure 13:
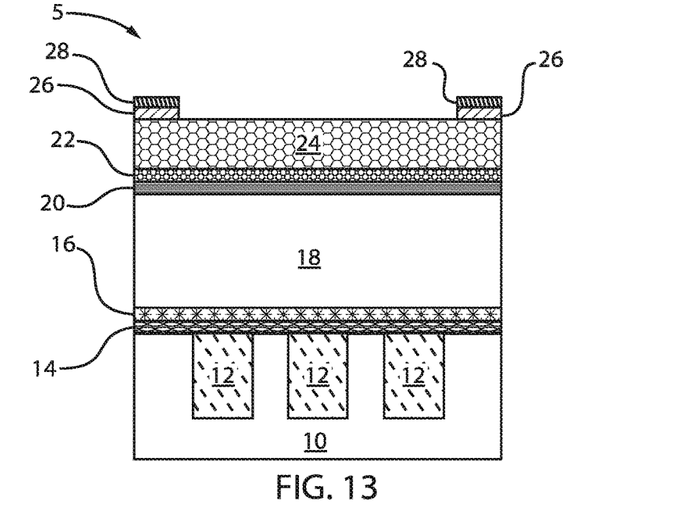
FIG. 13 is a cross-sectional view of the semiconductor structure including at least a plurality of metal lines, in accordance with another embodiment of the present invention.

FIG. 13 is a cross-sectional view of the semiconductor structure including at least a plurality of metal lines, in accordance with another embodiment of the present invention.

A semiconductor structure 5 includes a plurality of metal lines 12 formed within a first inter-layer dielectric (ILD) 10. An insulating etch stop layer 14 can be formed over the metal lines 12. A barrier layer 16 can be formed over the insulating etch stop layer 14. A second ILD 18 can be formed over the barrier layer 16. Then a first sacrificial layer 20 and a second sacrificial layer 22 can be formed over the second ILD 18. An organic planarization layer (OPL) 24 can then be formed over the first and second sacrificial layers 20, 22. Additionally, an anti-reflective coating (ARC) layer 26 and a photoresist layer 28 can be formed over portions of the OPL 24.

Figure 14:
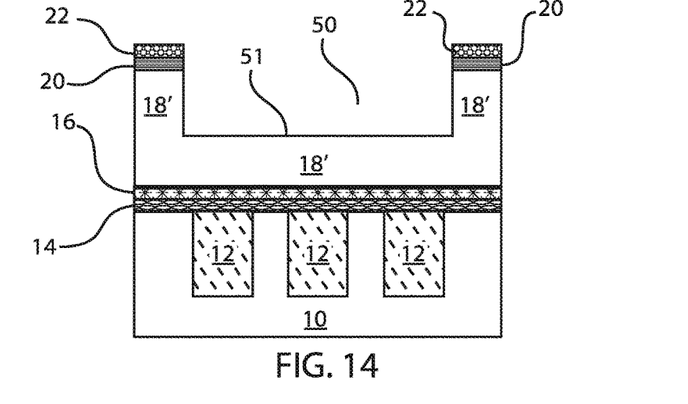
FIG. 14 is a cross-sectional view of the semiconductor structure of FIG. 13 where recessing takes place to expose a top surface of the second inter-layer dielectric (ILD), in accordance with an embodiment of the present invention.

FIG. 14 is a cross-sectional view of the semiconductor structure of FIG. 13 where recessing takes place to expose a top surface of the second inter-layer dielectric (ILD), in accordance with an embodiment of the present invention.

In various example embodiments, the OPL 24, the second sacrificial layer 22, the first sacrificial layer 20, and the second ILD 18 are etched to form an opening or trench 50 to expose a top surface 51 of the remaining second ILD 18'. Therefore, second ILD 18' remains in direct contact with the barrier layer 16.

Figure 15:
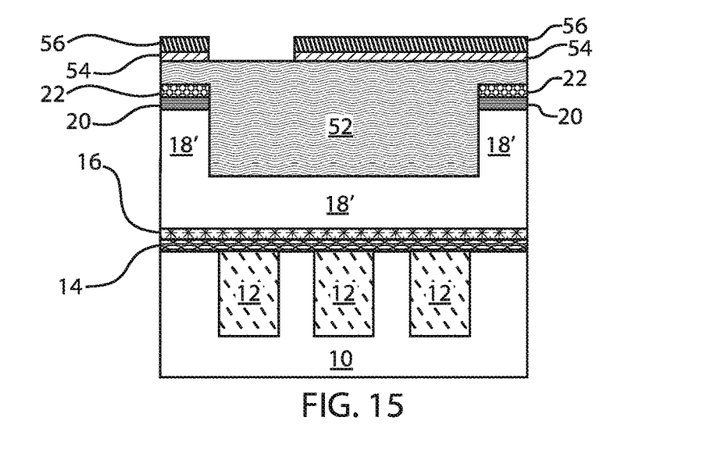
FIG. 15 is a cross-sectional view of the semiconductor structure of FIG. 14 where an organic planarization layer (OPL), an anti-reflective coating (ARC) layer, and a photoresist are deposited, in accordance with an embodiment of the present invention.

FIG. 15 is a cross-sectional view of the semiconductor structure of FIG. 14 where an organic planarization layer (OPL), an anti-reflective coating (ARC) layer, and a photoresist are deposited, in accordance with an embodiment of the present invention.

In various example embodiments, a second OPL 52 is deposited within the opening or trench 50 and in direct contact with the top surface of the remaining second ILD 18'. A second ARC layer 54 is deposited over the second OPL 52. Additionally, a second photoresist 56 is deposited over the second ARC layer 54. The photoresist 56 is designed such that only one metal line 12 will be exposed with further processing.

Figure 16:
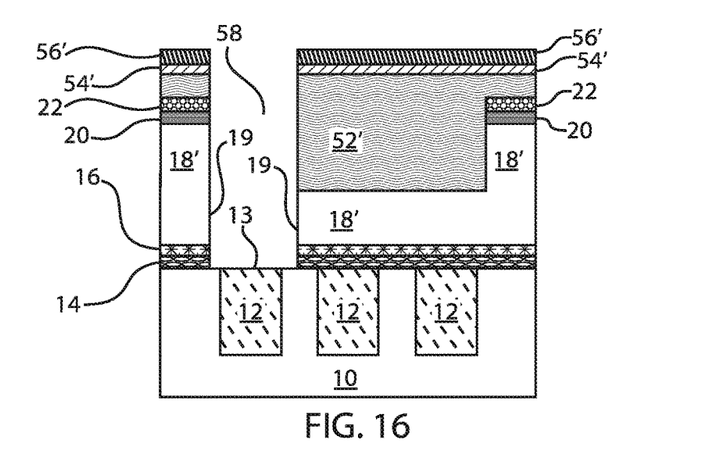
FIG. 16 is a cross-sectional view of the semiconductor structure of FIG. 15 where the photoresist is removed, and the OPL and ARC layer are etched to expose a top surface of a metal line, in accordance with another embodiment of the present invention.

FIG. 16 is a cross-sectional view of the semiconductor structure of FIG. 15 where the photoresist is removed, and the OPL and ARC layer are etched to expose a top surface of a metal line, in accordance with another embodiment of the present invention.

In various example embodiments, etching takes place to expose a top surface 13 of one metal line 12. The etching results in opening or trench 58 formed over the exposed metal line 12. Remaining second OPL 52', remaining second ARC layer 54', and remaining photoresist 56' are formed over one or more non-exposed metal lines 12.

Figure 17:
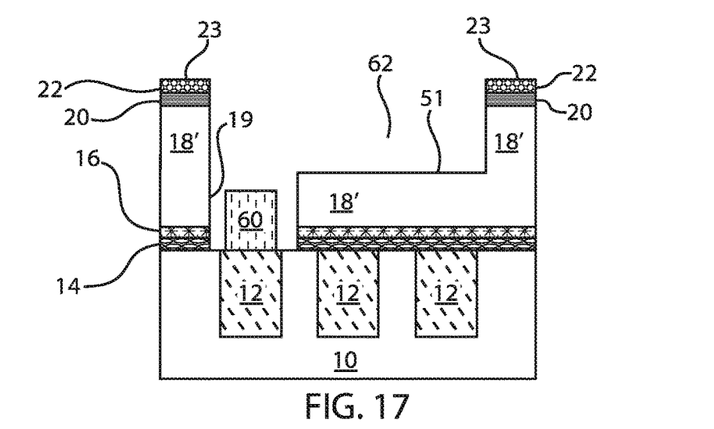
FIG. 17 is a cross-sectional view of the semiconductor structure of FIG. 16 where a self-aligned via interconnect structure is formed over the exposed metal line, in accordance with an embodiment of the present invention.

FIG. 17 is a cross-sectional view of the semiconductor structure of FIG. 16 where a self-aligned via interconnect structure is formed over the exposed metal line, in accordance with an embodiment of the present invention.

In various example embodiments, the remaining OPL 52' and the remaining ARC layer 54' and the remaining photoresist 56' are removed to create gap 62 and to expose a top surface 51 of the remaining second ILD 18'. The remaining OPL 52' and the remaining ARC layer 54' and the remaining photoresist 56' can be removed by, e.g., wet etch techniques. Furthermore, in various example embodiments, a self-aligned via interconnect structure or metal growth 60 is formed over the exposed metal line 12.

Figure 18:
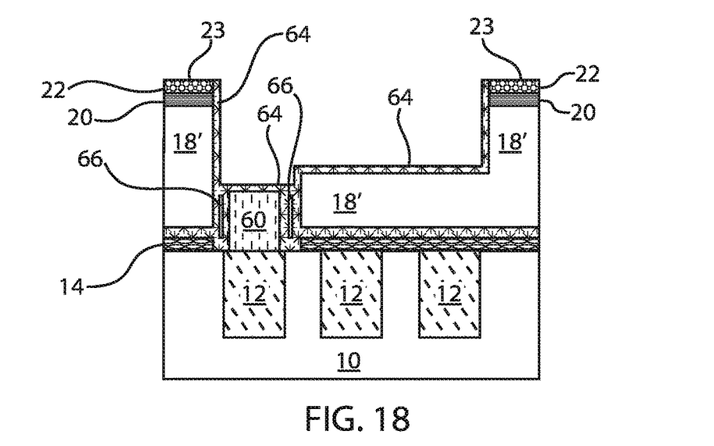
FIG. 18 is a cross-sectional view of the semiconductor structure of FIG. 17 where a conformal metal nitride layer is deposited, in accordance with an embodiment of the present invention.

FIG. 18 is a cross-sectional view of the semiconductor structure of FIG. 17 where a conformal metal nitride layer is deposited, in accordance with an embodiment of the present invention.

In various example embodiments, a conformal metal nitride layer 64 is deposited such that air gaps 66 are formed between the remaining second ILD 18' and the self-aligned via interconnect structure 60.

Figure 19:
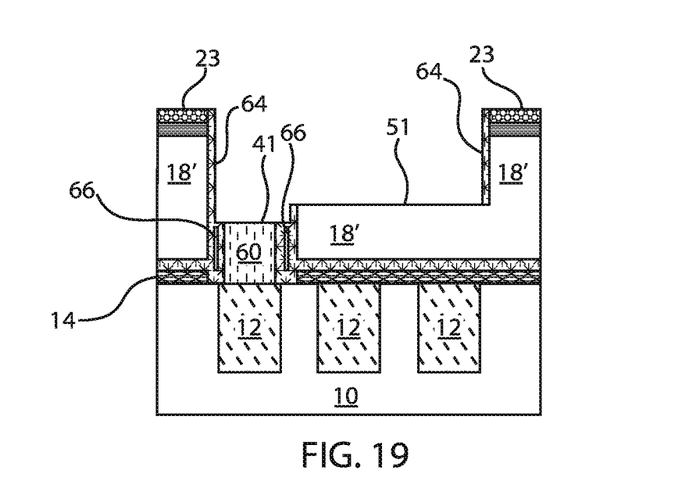
FIG. 19 is a cross-sectional view of the semiconductor structure of FIG. 18 where the exposed conformal metal nitride layer is removed to expose a top surface of the self-aligned via interconnect structure, in accordance with an embodiment of the present invention.

FIG. 19 is a cross-sectional view of the semiconductor structure of FIG. 18 where the exposed conformal metal nitride is removed to expose a top surface of the self-aligned via interconnect structure, in accordance with an embodiment of the present invention.

In various example embodiments, portions of the conformal metal nitride layer 64 are removed to expose a top surface 51 of the remaining second ILD 18' and to expose a top surface 41 of the self-aligned via interconnect structure 60. The airgaps 66 remain intact between the remaining second ILD 18' and the self-aligned via interconnect structure 60.

Figure 20:
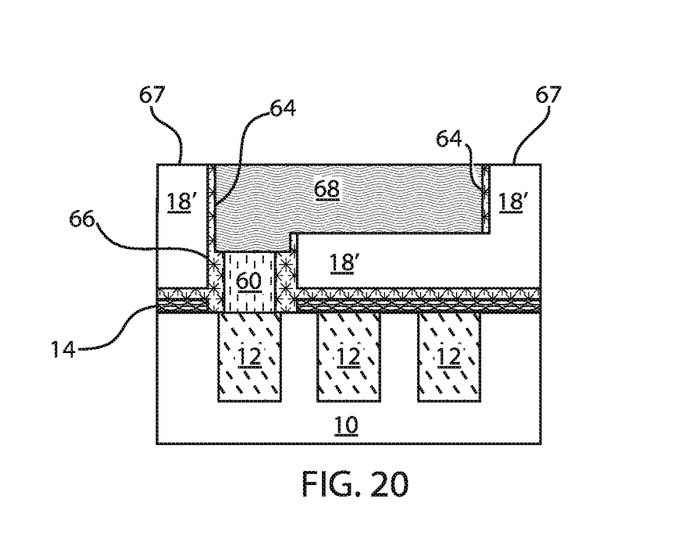
FIG. 20 is a cross-sectional view of the semiconductor structure of FIG. 19 where a metal fill takes place, the metal fill being planarized, in accordance with an embodiment of the present invention.

FIG. 20 is a cross-sectional view of the semiconductor structure of FIG. 19 where a metal fill takes place, the metal fill being planarized, in accordance with an embodiment of the present invention.

In various example embodiments, a conductive material 68 can be deposited. The conductive material 68 can be, for example, a metal or doped polysilicon (poly-Si). Non-limiting examples of metals include copper (Cu), cobalt, (Co), aluminum (Al), platinum (Pt), gold (Au), tungsten (W), titanium (Ti), or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In various example embodiments, the conductive material 68 can be planarized. The remaining conductive material 68 can be flush with the top surface 67 of the remaining second ILD 18'. In various exemplary embodiments, the height of the conductive material 68 can be reduced by chemical-mechanical polishing (CMP) and/or etching. Therefore, the planarization process can be provided by CMP. Other planarization process can include grinding and polishing.

In summary, the exemplary embodiments of the present invention employ selective metal deposition to "build up" vias self-aligned to the intersection of Mx and Mx+1 trench patterns, relaxing any influence of trench and via litho variation or overlay. In one embodiment, an Mx+1 trench first dielectric etch is performed to reveal underlying Mx structures, then after blocking intersections where no via is to be formed, perform selective deposition of metal via to build up a metal protrusion. Then the methods deposit and recess a gap fill dielectric material to surround and encase the grown via "pillars." After opening or removing any remaining hardmask or cap material, single damascene metallization and CMP can be performed.

The interconnect structures disclosed herein can be incorporated into any electrical device. For example, the interconnect structures can be present within electrical devices that use semiconductors that are present within integrated circuit chips. The integrated circuit chips including the disclosed interconnects can be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processing unit.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for employing selective metal deposition to build-up vias self-aligned to the intersection of Mx and Mx+1 trench patterns (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for creating a fully-aligned via (FAV) by employing selective metal deposition, the method comprising:
   forming metal lines within a first inter-layer dielectric (ILD) layer;
   forming a second ILD layer over the first ILD layer;
   forming a lithographic stack over the second ILD layer to define areas where via growth is prevented;
   recessing the lithographic stack to expose a top surface of the metal lines where via growth is permitted by the lithographic stack; and
   performing metal growth over the exposed top surface of the metal lines where via growth is permitted; and
   removing the lithographic stack and depositing a conformal metal nitride cap in direct contact with a top surface and an entire length of sidewalls of the metal growth.

2. The method of claim 1, further comprising depositing a low-k material layer over the conformal metal nitride cap.

3. The method of claim 2, further comprising recessing the low-k material layer to expose a top surface of the conformal metal nitride cap over the metal growth.

4. The method of claim 3, further comprising removing the exposed top surface of the conformal metal nitride cap over the metal growth to expose a top surface of the metal growth.

5. The method of claim 4, further comprising performing single damascene metallization over the exposed top surface of the metal growth.

6. The method of claim 5, wherein the metal growth is one or more self-aligned via interconnect structures.

7. The method of claim 6, wherein, after the recessing of the low-k material layer, portions of the low-k material layer remain between the metal growth and the second ILD layer.

8. The method of claim 1, further comprising forming an insulating etch stop layer over the metal lines before forming the second ILD layer.

9. A method for creating a fully-aligned via (FAV) by employing selective metal deposition, the method comprising:
   forming metal lines within a first inter-layer dielectric (ILD) layer;
   forming an insulating etch stop layer over the metal lines;
   forming a second ILD layer over the insulating etch stop layer;
   forming a lithographic stack over the second ILD layer to define areas where via growth is prevented;
   recessing the lithographic stack to expose a top surface of the metal lines where via growth is permitted by the lithographic stack;
   performing metal growth over the exposed top surface of the metal lines where via growth is permitted; and
   depositing a conformal metal nitride cap over the metal growth such that airgaps are formed between the metal growth and the second ILD layer.

10. The method of claim 9, further comprising removing the lithographic stack before depositing the metal growth.

11. The method of claim 10, further comprising removing the exposed top surface of the conformal metal nitride cap over the metal growth to expose a top surface of the metal growth.

12. The method of claim 11, further comprising performing single damascene metallization over the exposed top surface of the metal growth.

13. The method of claim 12, wherein the metal growth is one or more self-aligned via interconnect structures.

14. The method of claim 9, wherein the lithographic stack includes at least two sacrificial layer and an organic planarization layer.

15. The method of claim 14, wherein the lithographic stack further includes an anti-reflective coating layer and a photoresist layer.

16. A semiconductor structure for creating a fully-aligned via (FAV) by employing selective metal deposition, the semiconductor structure comprising:
   metal lines disposed within a first inter-layer dielectric (ILD) layer;
   a second ILD layer disposed over the first ILD layer;
   a metal growth disposed over exposed metal lines where via growth is permitted; and
   a conformal metal nitride cap disposed over the metal growth such that airgaps are formed between the metal growth and the second ILD layer.

17. The semiconductor structure of claim 16, wherein an insulating etch stop layer is disposed over the metal lines before depositing the second ILD layer.

18. The semiconductor structure of claim 17, wherein a conductive material is disposed over the metal growth by employing single damascene metallization.

19. The semiconductor structure of claim 18, wherein the conductive material, the metal growth, and the exposed metal lines are aligned.

* * * * *